United States Patent
Kang et al.

(10) Patent No.: US 7,109,575 B2
(45) Date of Patent: Sep. 19, 2006

(54) LOW-COST FLEXIBLE FILM PACKAGE MODULE AND METHOD OF MANUFACTURING THE SAME

(75) Inventors: Sa-Yoon Kang, Seoul (KR); Dong-Han Kim, Osan-si (KR); Ye-Chung Chung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 31 days.

(21) Appl. No.: 10/862,337

(22) Filed: Jun. 8, 2004

(65) Prior Publication Data

US 2005/0040504 A1    Feb. 24, 2005

(30) Foreign Application Priority Data

Aug. 5, 2003    (KR)    .................... 10-2003-0054221

(51) Int. Cl.
*H01L 23/02*    (2006.01)
*H01L 23/48*    (2006.01)
*H01L 23/12*    (2006.01)
*H01L 23/52*    (2006.01)
*H01L 29/40*    (2006.01)

(52) U.S. Cl. ...................... 257/685; 257/686; 257/688; 257/689; 257/700; 257/723; 257/729; 257/730; 257/731; 257/773; 257/E23.055; 257/E23.065; 257/E23.177

(58) Field of Classification Search ........ 257/685–686, 257/688, 689, 700, 729–731, 723, 773, E23.055, 257/E23.065, E23.078, E23.177
See application file for complete search history.

(56) References Cited

U.S. PATENT DOCUMENTS 5,332,921 A  *  7/1994  Dousen et al. .............. 257/685
5,397,916 A  *  3/1995  Normington ................ 257/686
5,398,128 A  *  3/1995  Tajima et al. ............... 349/150

(Continued)

FOREIGN PATENT DOCUMENTS

JP           07-239479           9/1995

(Continued)

OTHER PUBLICATIONS

Korean Office Action Jul. 25, 2005 for Korean Application No. 10-2003-0054221 (w/full English translation).

(Continued)

*Primary Examiner*—Ida M. Soward
(74) *Attorney, Agent, or Firm*—Harness, Dickey & Pierce, P.L.C.

(57) ABSTRACT

Provided are a flexible film package module and a method of manufacturing the same that can be adapted for manufacture at lower cost and/or to adapt the characteristics of the flexible film package module for specific applications. The lower-cost flexible film package module includes a tape film that combines both a first insulating substrate, typically formed from a higher-cost polyimide material, and a second insulating substrate, typically formed from an insulating material or materials that are less expensive and/or provide modified performance when compared with the first insulating material. Both the first and second substrates will include complementary circuit patterns that will be electrically and physically connected to allow the composite substrate to function as a unitary substrate. The first and second substrates will also include connection regions that may be adapted for connection to printed circuit boards and/or electronic devices such as liquid crystal displays.

9 Claims, 9 Drawing Sheets

U.S. PATENT DOCUMENTS

| | | | |
|---|---|---|---|
| 5,428,190 A * | 6/1995 | Stopperan | 174/261 |
| 5,448,511 A * | 9/1995 | Paurus et al. | 365/52 |
| 5,770,300 A * | 6/1998 | Okamoto et al. | 428/209 |
| 5,838,412 A * | 11/1998 | Ueda et al. | 349/150 |
| 6,061,246 A | 5/2000 | Oh et al. | 361/749 |
| 6,486,544 B1 * | 11/2002 | Hashimoto | 257/686 |
| 6,670,700 B1 * | 12/2003 | Hashimoto | 257/686 |
| 2002/0050641 A1 * | 5/2002 | Freeman | 257/737 |
| 2004/0000707 A1 * | 1/2004 | Roper et al. | 257/686 |
| 2004/0150085 A1 * | 8/2004 | Takahashi et al. | 257/678 |
| 2005/0012194 A1 * | 1/2005 | Jaeck | 257/686 |

FOREIGN PATENT DOCUMENTS

| | | |
|---|---|---|
| JP | 11-326937 | 11/1999 |
| KR | 10-2002-00090392 | 5/2002 |

OTHER PUBLICATIONS

Korean Office Action dated Jan. 17, 2006 with translation.

* cited by examiner

LOW-COST FLEXIBLE FILM PACKAGE MODULE AND METHOD OF MANUFACTURING THE SAME

CROSS-REFERENCE TO RELATED APPLICATIONS

This application claims priority from Korean Patent Application No. 2003-54221, which was filed on Aug. 5, 2003, in the Korean Intellectual Property Office, the disclosure of which is incorporated herein in its entirety by reference.

BACKGROUND OF THE INVENTION

1. Field of the Invention

The present invention relates to a semiconductor device used for a liquid crystal display (LCD) device and, more particularly, to a flexible film package.

2. Description of the Related Art

In recent years, the rapid development of LCD-related technologies has accelerated the shift to an information-oriented society. In general, data communication electronic devices in which an LCD is utilized are required to be thin, light-weight, and compact for portable use. Thus, new methods of mounting semiconductor chips on semiconductor packages have been proposed for LCD devices.

While micro ball grid array (μ-BGA)-type semiconductor packages were widely used for conventional data communication electronic devices that incorporated an LCD, flexible film packages are currently being increasingly utilized. A flexible film package is a semiconductor package in which a semiconductor chip is directly attached onto a flexible thin-tape-type film so as to reduce the area occupied by the mounted semiconductor chip.

Flexible film packages do not generally utilize solder balls as external connection terminals but instead rely on an anisotropic conductive film (ACF) that is directly attached to a printed circuit board (PCB) or a glass panel for an LCD. The flexible film packages include broad categories such as tape carrier packages (TCP), chip on film (CoF) packages and other configurations known in the packaging arts.

FIG. 1 is a plan view of a conventional flexible film package module, illustrating the manner in which the flexible film package module is mounted on an LCD substrate. As illustrated in FIG. 1, in a conventional LCD device, semiconductor packages for controlling light, for example, a plurality of flexible film packages 100, are mounted on a top surface of a glass panel 300, and semiconductor packages 600, on each of which a gate integrated circuit (IC) for controlling voltage may be mounted, are formed on a lateral surface of the glass panel 300.

The flexible film packages 100 are bent and mounted on the glass panel 300 and connected to a PCB 200, which is positioned behind the glass panel 300. The PCB 200 may be considerably larger than the individual packages so that a plurality of flexible film packages 100 may all be attached thereto. A plurality of semiconductor devices 210 for operating the LCD device may be installed at other locations on the PCB 200.

FIG. 2 is a plan view of one flexible film package 100 shown in FIG. 1. As illustrated in FIG. 2, no semiconductor chip has yet been mounted on the flexible film package 100. The flexible film package 100 is formed from a polyimide film 10, which has an excellent coefficient of thermal expansion (CTE) and is highly durable. A chip paddle 18 is formed on the polyimide film 10, and the circuit pattern of the chip paddle 18 is, in turn, connected to a copper pattern 16 that is configured for extending and attaching to both the PCB and the glass panel.

A semiconductor chip (110 of FIG. 3) may be attached to the chip paddle 18 using bump connectors and one or more slit holes 20 may be formed in the polyimide film 10 so that the polyimide film may be more easily bent. In FIG. 2, B1 designates a portion of the flexible film package 100 that is attached to the PCB while B2 designates a portion of the flexible film package 100 which is attached to the glass panel. TP1 and TP2 designate conductive pads that may be used for electrical inspection and testing conducted after the flexible film package 100 has been completed. A1 designates a region where a solder resist may be is coated in order to protect the copper pattern 16 from damage or corrosion resulting from to external forces or contaminants and shorts between leads caused by conductive particulates or other foreign materials. A2 designates a cutting line along which each of the individual flexible film packages 100 may be separated from other adjacent flexible packages and excess polyimide film after the assembly and electrical inspection have been completed to obtain an individual flexible film package.

FIG. 3 is a cross-sectional view of the flexible film package module of FIG. 1, illustrating the shape in which the flexible film package module is bent. As illustrated in FIG. 3, the bent flexible film package 100 is attached to edges of a glass panel 300 and a PCB 200. A protective cover 700, typically metal, may be disposed outside the glass panel 300 and the PCB 200. A light emission unit 400, for example, a fluorescent light, may be mounted between the glass panel 300 and the PCB 200, with a filler 500, through which light may be transmitted, filling the space between the glass panel and the PCB. Thus, light from the light emission unit 400 transmits the filler 500 and penetrates the glass panel to create an image.

As illustrated in FIG. 3, the copper pattern 16 formed on the polyimide tape may be connected to the glass panel 300 and the PCB 200 using an ACF 180. Reference numeral 202 denotes a copper pattern formed on the PCB 200.

A conventional flexible film package is disclosed in U.S. Pat. No. 6,061,246, dated May 9, 2000, entitled "Microelectric Package Including Flexible Layers and Flexible Extensions, and Liquid Crystal Display Modules Using the Same." However, conventional flexible film packages have certain limitations. For example, although the polyimide films used to form the flexible film package tend to have excellent durability and CTE, they also tend to be very expensive so that a semiconductor package manufacturing process that uses a polyimide film will tend to be more costly than one that does not. Substantially, when a conventional flexible film package is manufactured, the production cost ratio between the semiconductor package and the incorporated semiconductor chip can be as much as 6:1, a cost ratio that is generally higher than that of other kinds of semiconductor packages. Therefore, reducing the production cost for flexible film semiconductor packages would strengthen the price competitiveness of such packages.

SUMMARY OF THE INVENTION

Exemplary embodiments of the present invention provide a lower-cost flexible film package module in which a tape film used in the flexible film package is formed from a lower-cost flexible printed circuit (FPC) insulating substrate in combination with a polyimide insulating substrate and a method of manufacturing such lower-cost flexible film package modules.

Exemplary embodiments of the present invention provide lower-cost flexible film package modules, comprising a plurality of semiconductor package main bodies, each of which comprises a first insulating substrate constituting a flexible film package for an LCD, the first insulating substrate formed of a polyimide material, a chip paddle formed on the first insulating substrate and a semiconductor chip mounted on the chip paddle, an input circuit pattern formed on the first insulating pattern for connecting a circuit pattern of the chip paddle to a printed circuit board, and an output circuit pattern formed on the first insulating substrate for connecting the circuit pattern of the chip paddle to a glass panel; and a input terminal connecting portion connected to the input circuit pattern of each of the semiconductor package main bodies, the input terminal connecting portion comprising a common second insulating substrate formed of a material that is less expensive than that of the first insulating substrate of each of the semiconductor package main bodies, and extending common input circuit patterns formed on the common second insulating substrate that are electrically connected to the input circuit pattern of each of the semiconductor package main bodies and finally connected to the printed circuit board.

The first insulating substrate of each of the semiconductor package main bodies can be configured with a range of lengths, for example, about 7 mm to 20 mm, and a range of thicknesses, for example, about 25 µm to 75 µm. The common second insulating substrate of the input terminal connecting portion can be formed using a material that has a lower coefficient of thermal expansion and is less durable than that of the first insulating substrate. The common second insulating substrate of the input terminal connecting portion can include through holes to form the extending common input circuit patterns therein. The common second insulating substrate of the input terminal connecting portion can be formed of a flexible material and have a thickness of about 50 µm to 120 µm. The extending common input circuit patterns of the input terminal connecting portion can be formed on a front surface or a rear surface and connected vertically to each other.

The input circuit pattern of each of the semiconductor package main bodies can be connected to the extended common input circuit patterns of the input terminal connecting portion using an anisotropic conductive film. The input circuit pattern of each of the semiconductor package main bodies can be applied to the extended common input circuit patterns of the input terminal connecting portion using thermocompression bonding. The semiconductor chip of each of the semiconductor package main bodies can be mounted on the chip paddle using bump connectors.

Another exemplary embodiment the present invention provides a method of manufacturing lower-cost flexible film package modules. The method comprises preparing a plurality of semiconductor package main bodies, each of which including a chip paddle formed on a first insulating substrate, a semiconductor chip is mounted on the chip paddle, a circuit pattern of the chip paddle is connected to a printed circuit board by an input circuit pattern, and other circuit pattern of the chip paddle is connected to a glass panel by an output circuit pattern; preparing a input terminal connecting portion, the input terminal connecting portion being connected to the input circuit pattern of each of the semiconductor package main bodies, the input terminal connecting portion comprising a common second insulating substrate formed of a material that is less expensive than that of the first insulating substrate of each of the semiconductor package main bodies and extending common input circuit patterns formed on the common second insulating substrate; and connecting the input circuit pattern of each of the semiconductor package main bodies to the extending common input circuit patterns of the lower-cost input terminal connecting portion.

The input circuit pattern of each of the semiconductor package main bodies can be connected to the extended common input circuit patterns of the lower-cost input terminal connecting portion by an anisotropic conductive film. The input circuit pattern of each of the semiconductor package main bodies can be connected to the extended common input circuit patterns of the input terminal connecting portions using thermocompression bonding which can include applying ultrasonic vibration in conjunction with heating.

The printed circuit board can have a smaller width than that of the lower-cost input terminal connecting portion, each of the semiconductor package main bodies can be a tape carrier package and each of the semiconductor package main bodies can be a chip on film package. The exemplary flexible film package modules of the present invention may use a tape film, which combines a first insulating substrate formed of a polyimide material and a second insulating substrate formed of a material that is less expensive than that of the first insulating substrate. Thus, the production costs associated with the flexible film package module can be reduced.

BRIEF DESCRIPTION OF THE DRAWINGS

The above and other features and advantages of the present invention will become more apparent when exemplary embodiments are described in detail with reference to the attached drawings in which.

Figure 1:
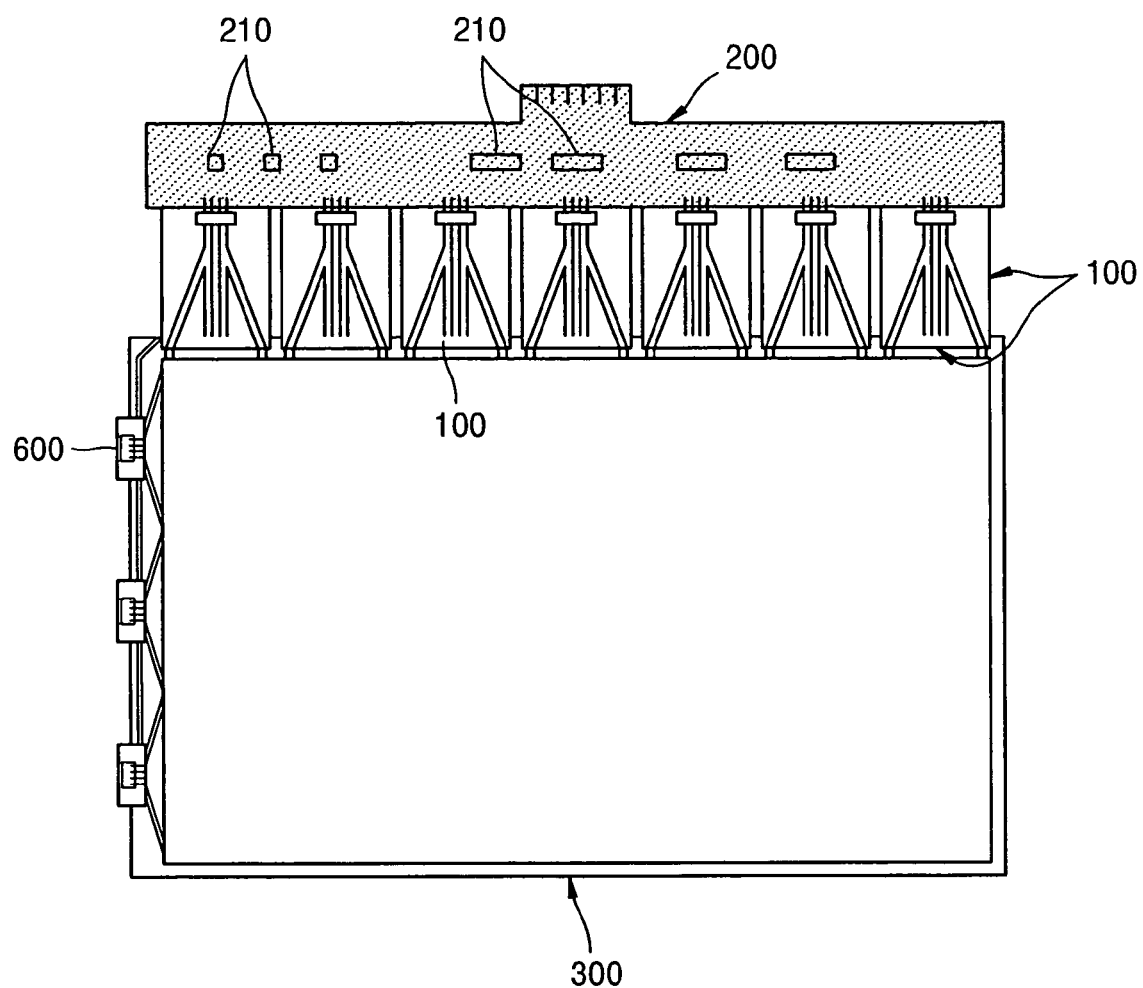
FIG. 1 is a plan view of a conventional flexible film package module.
Figure 2:
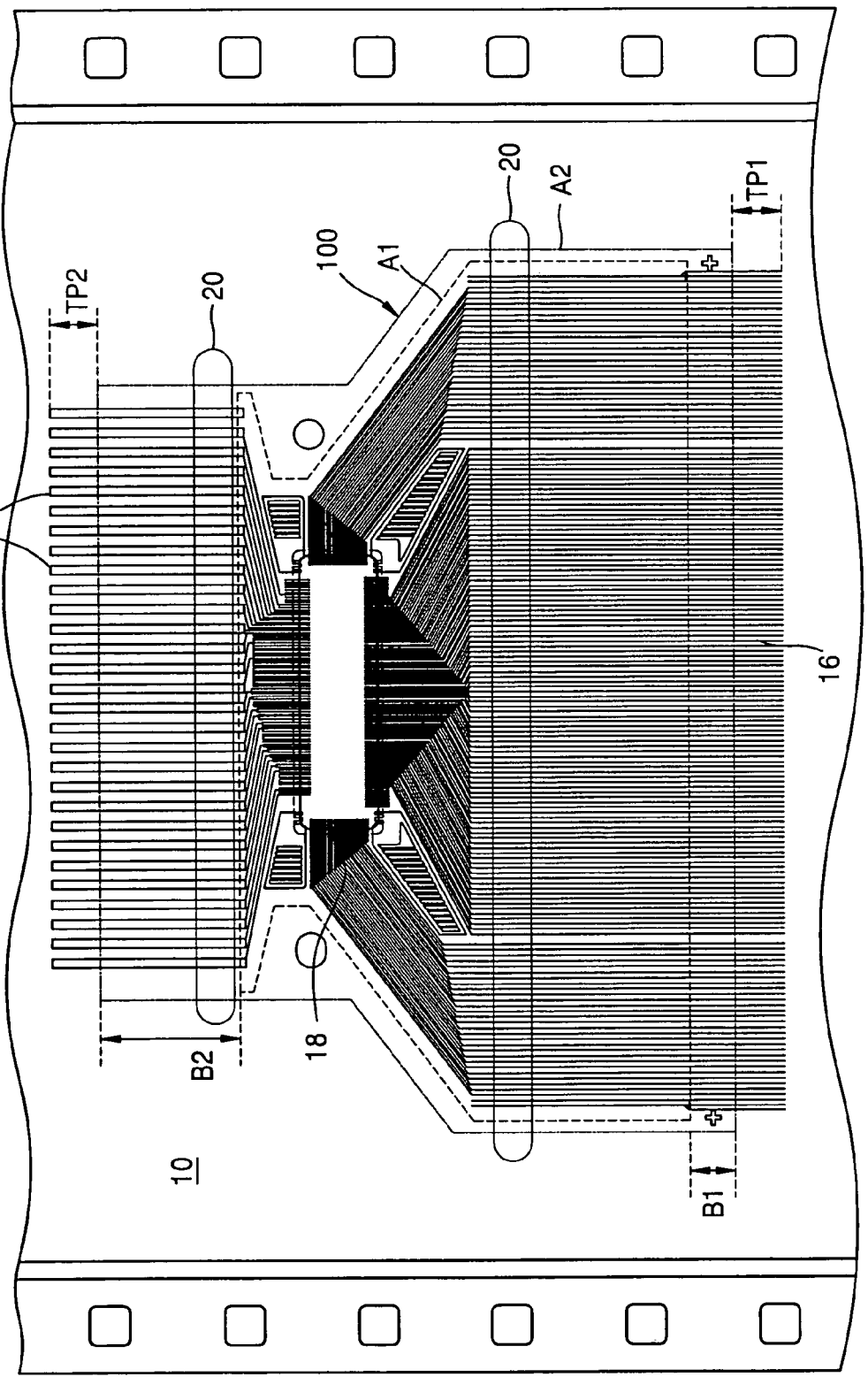
FIG. 2 is a plan view of one conventional flexible film package 100 shown in FIG. 1.

These drawings have been provided to assist in the understanding of the exemplary embodiments of the invention as described in more detail below and should not be construed as unduly limiting the invention. In particular, the relative spacing, positioning, sizing and dimensions of the various elements illustrated in the drawings are not drawn to scale and may have been exaggerated, reduced or otherwise modified for the purpose of improved clarity. Those of ordinary skill in the art will also appreciate that a range of alternative configurations have been omitted simply to improve the clarity and reduce the number of drawings.

DETAILED DESCRIPTION OF EXEMPLARY EMBODIMENTS

The present invention will now be described more fully with reference to the accompanying drawings, in which exemplary embodiments of the invention are shown. This invention may, however, be embodied in many different forms and should not be construed as being limited to solely the embodiments set forth herein. Rather, these exemplary embodiments are provided so that this disclosure will be thorough and complete, and will fully convey the concept of the invention to those skilled in the art.

Figure 4:
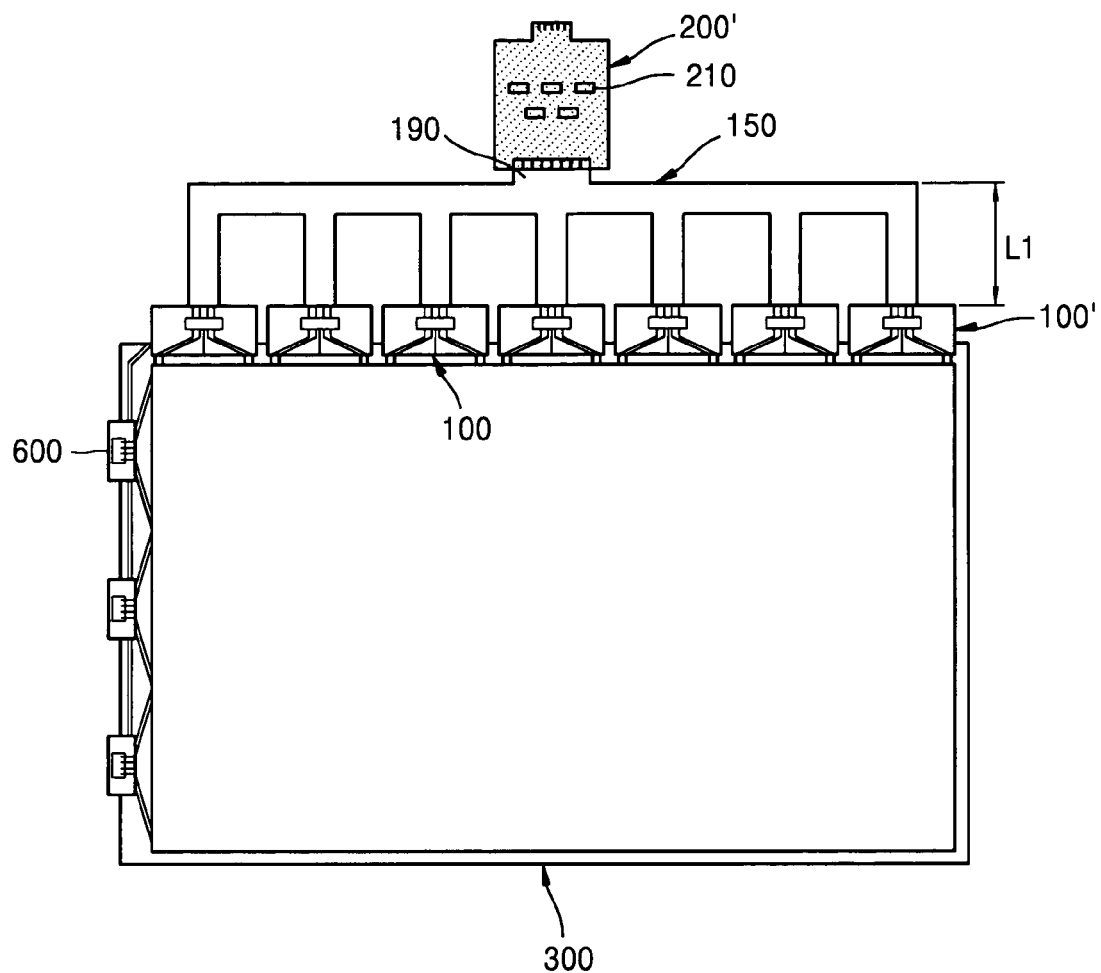
FIG. 4 is a plan view of a flexible film package module according to an exemplary embodiment of the present invention.

As illustrated in FIG. 4, a lower-cost flexible film package module according to an embodiment of the present invention is comprised of a plurality of semiconductor package main bodies 100 and a lower-cost input terminal connecting portion 150. Each of the semiconductor package main bodies 100 is obtained by reducing by as much as 50% to 67% the length of a conventional flexible film package. For example, while a conventional flexible film package may have a typical length of about 19 mm to 38 mm, the corresponding semiconductor package main body 100 utilized in exemplary embodiments of the present invention will have a length of about 7 mm to 20 mm. This size reduction will tend to translate directly into reduced costs for the polyimide material compared with a conventional flexible package construction. The lower-cost input terminal connecting portion 150 is provided to cooperate with the semiconductor package main body 100 to provide the necessary electrical connections to the PCB and glass panel.

The lower-cost input terminal connecting portion 150 is formed from a second insulating substrate, which tends to have a lower CTE and/or be less durable (and less expensive) than the polyimide material that is used to form the first insulating substrate. Thus, lower-cost flexible film package modules according to the present invention include a semiconductor package main body 100 and lower-cost input terminal connecting portion 150 which are connected to each other. In FIG. 4, L1 denotes the length of the second insulating substrate that replaces a portion of the polyimide insulating substrate utilized in conventional flexible film packages.

Because PCB 200' can also be scaled down by changing the shape of the lower-cost input terminal connecting portion 150, the production cost of an LCD device utilizing this construction can be reduced even further. In FIG. 4, reference numeral 190 denotes a final connecting portion between the low-cost input terminal connecting portion 150 and PCB 200', 210 denotes a semiconductor device, which is mounted on the PCB and used to operate the LCD device, 300 denotes a glass panel, and 600 denotes a semiconductor package that functions as a gate IC.

Figure 5:
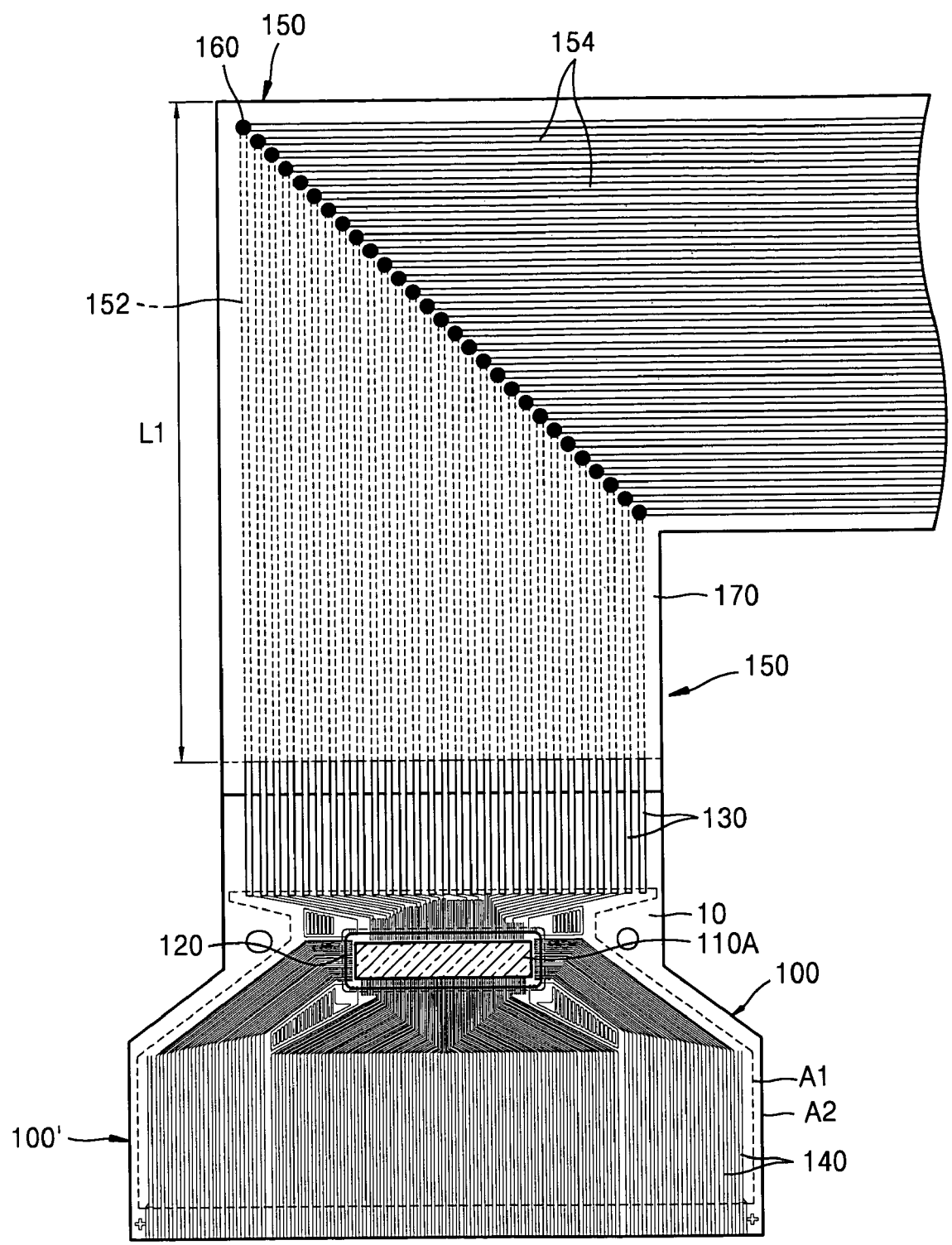
FIG. 5 is a plan view of the exemplary flexible film package shown in FIG. 4.

FIG. 5 is a plan view of the flexible film package shown in FIG. 4. As illustrated in FIG. 5, the exemplary lower-cost flexible film package modules of the present invention comprise a plurality of semiconductor package main bodies 100, each of which includes a first insulating substrate 10, a chip paddle 120, a semiconductor chip 110A, an input circuit pattern 130 and an output circuit pattern 140. The first insulating substrate 10 may be formed from a polyimide material, a material widely used for forming flexible film packages for LCDs. The chip paddle 120 is formed on the first insulating substrate 10 with the semiconductor chip 110A being mounted on the chip paddle 120 using bump connectors. The input circuit pattern 130 is formed on the first insulating substrate 10 and connects a circuit pattern of the chip paddle 120 to a PCB. The output circuit pattern 140 is formed on the first insulating substrate 10 and connects the circuit pattern of the chip paddle 120 to a glass panel.

Also, the lower-cost flexible film package module further comprises a lower-cost input terminal connecting portion 150, which is connected to the input circuit pattern 130 of each of the semiconductor package main bodies 100. The low-cost input terminal connection portion 150 is formed on a common second insulating substrate 170 and includes extended common input circuit patterns 152, 160 and 154. The common second insulating substrate 170 is formed of a material that is less expensive than that used to form the first insulating substrate 10, e.g., polyimide. The extended common input circuit patterns 152, 160 and 154 that are formed on the common second insulating substrate 170 may be connected to the input circuit patterns 130 of the semiconductor package main bodies 100 using an ACF or thermo-compression bonding and, finally, connected to the PCB.

Because the lower-cost input terminal connecting portion 150 having a length L1 is formed of the second insulating substrate 170, which may have a lower CTE and be somewhat less durable a higher-cost polyimide material, but which can still provide acceptable performance and reliability, the entire production cost of the flexible package can be reduced.

The second insulating substrate 170 can be a flexible print circuit (FPC) insulating substrate. The pitch of the copper patterns formed on the FPC insulating substrate 170 will not generally be as fine as that of copper patterns formed on a polyimide insulating substrate, but the FPC insulating substrate 170 is flexible and can include through holes therein. Also, because the input circuit pattern 130 of the flexible film package 100 need not be as fine as the output circuit pattern 140 that is connected to the glass panel, the FPC insulating substrate can be used successfully as the second insulating substrate 170.

Figure 6:
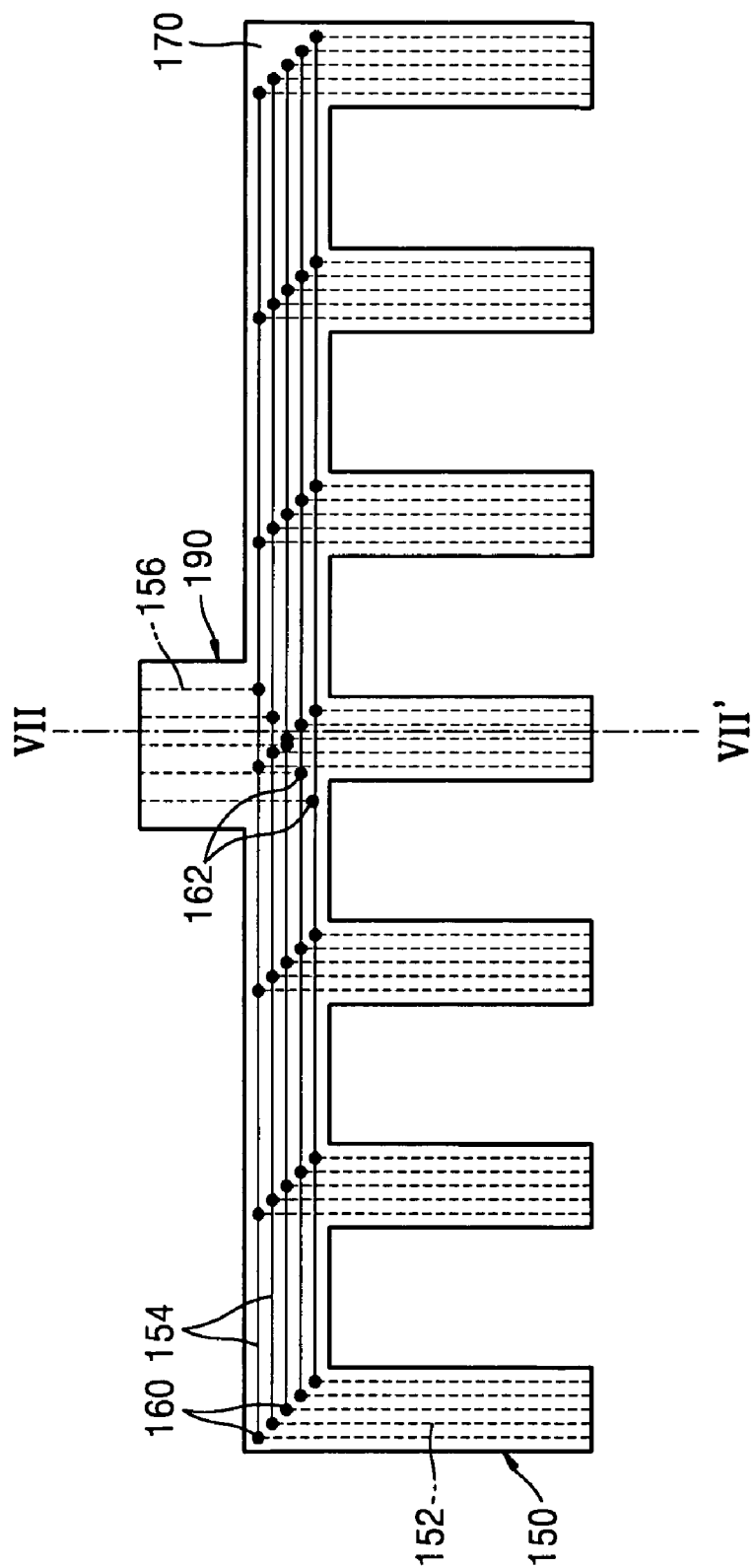
FIG. 6 is a plan view of an exemplary lower-cost input terminal connecting portion shown in FIG. 4.
Figure 7:
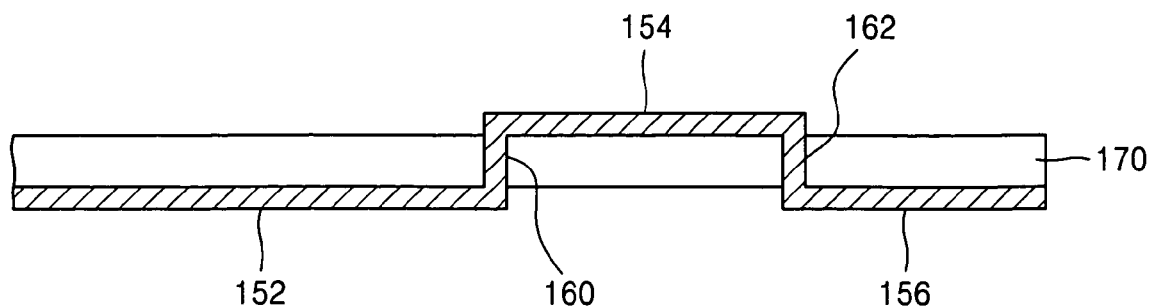
FIG. 7 is a cross-sectional view taken along line VII–VII' of FIG. 6.

FIG. 6 is a plan view of a lower-cost input terminal connecting portion 150 as shown in FIG. 4, and FIG. 7 is a cross-sectional view taken along line VII–VII' of FIG. 6. As illustrated in FIGS. 6 and 7, the lower-cost input terminal connecting portion 150 of the present invention comprises a common second insulating substrate 170 and extended common input circuit patterns 152, 160, 154, 162 and 156, formed on the second insulating substrate 170. The extending common input circuit patterns 152, 160, 154, 162 and 156 may be copper patterns for electrically connecting an input circuit pattern 130 of a semiconductor package main body 100 to a PCB. The extended common input circuit patterns 152, 160, 154, 162 and 156 are structured such that linear copper interconnections 152, 154 and 156, which may be disposed on a front surface and/or a rear surface of the second insulating substrate 170, may be vertically connected to each other via through holes 160 and 162 formed in the second insulating substrate.

Figure 8:
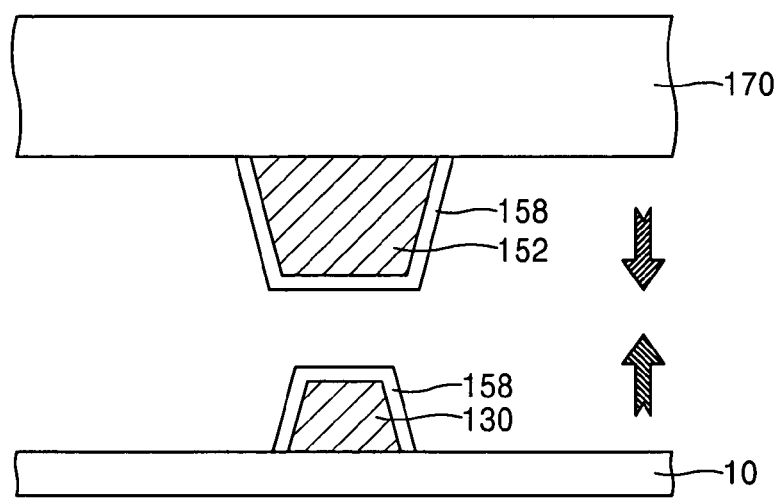
FIG. 8 is a cross-sectional view illustrating a method of connecting a semiconductor package main body to an exemplary lower-cost input terminal connecting portion according to an embodiment of the present invention.
Figure 9:
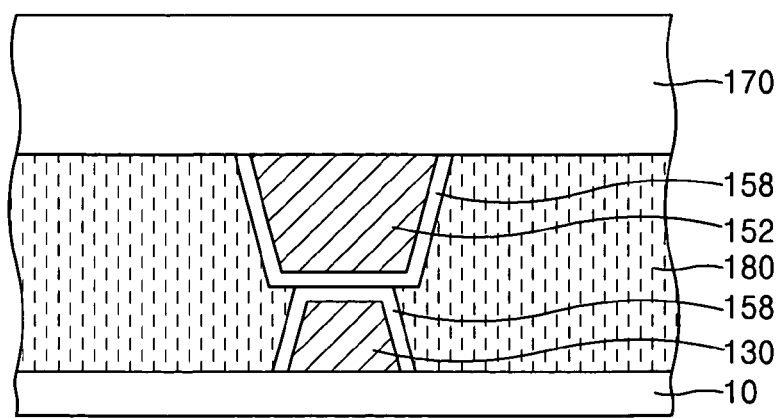
FIG. 9 is a cross-sectional view illustrating an exemplary method of connecting a semiconductor package main body to a lower-cost input terminal connecting portion according to another embodiment of the present invention.

FIG. 8 is a cross-sectional view illustrating an exemplary method of connecting a semiconductor package main body to a lower-cost input terminal connecting portion according to an exemplary embodiment of the present invention, and FIG. 9 is a cross-sectional view illustrating an exemplary method of connecting a semiconductor package main body to a lower-cost input terminal connecting portion according to another exemplary embodiment of the present invention.

As illustrated in FIG. 8, a conductive material layer that is easily melted, for example, a tin (Sn) or solder layer 158, may be coated on the extended common input circuit pattern 152 that is formed on the common second insulating substrate 170 and the input circuit pattern 130 that is formed on the first insulating substrate 10. Thereafter, the patterns are aligned and heat is applied to the conductive material layer 158 and/or the patterns are compressed to connect and secure the semiconductor package main body to the lower-cost input terminal connecting portion.

As illustrated in FIG. 9, the second insulating substrate 170 on which the extended common input circuit pattern 152 is formed for contacting the first insulating substrate 10 on which the input circuit pattern 130 is formed. Using this construction, the second insulating substrate 170 can be connected to the first insulating substrate 10 using a layer of an ACF 180 or other suitable material. A tin or solder layer 158 or another adhesive material that can be easily melted and then hardened can be used to secure the main body to the terminal connection portion.

Figure 10:
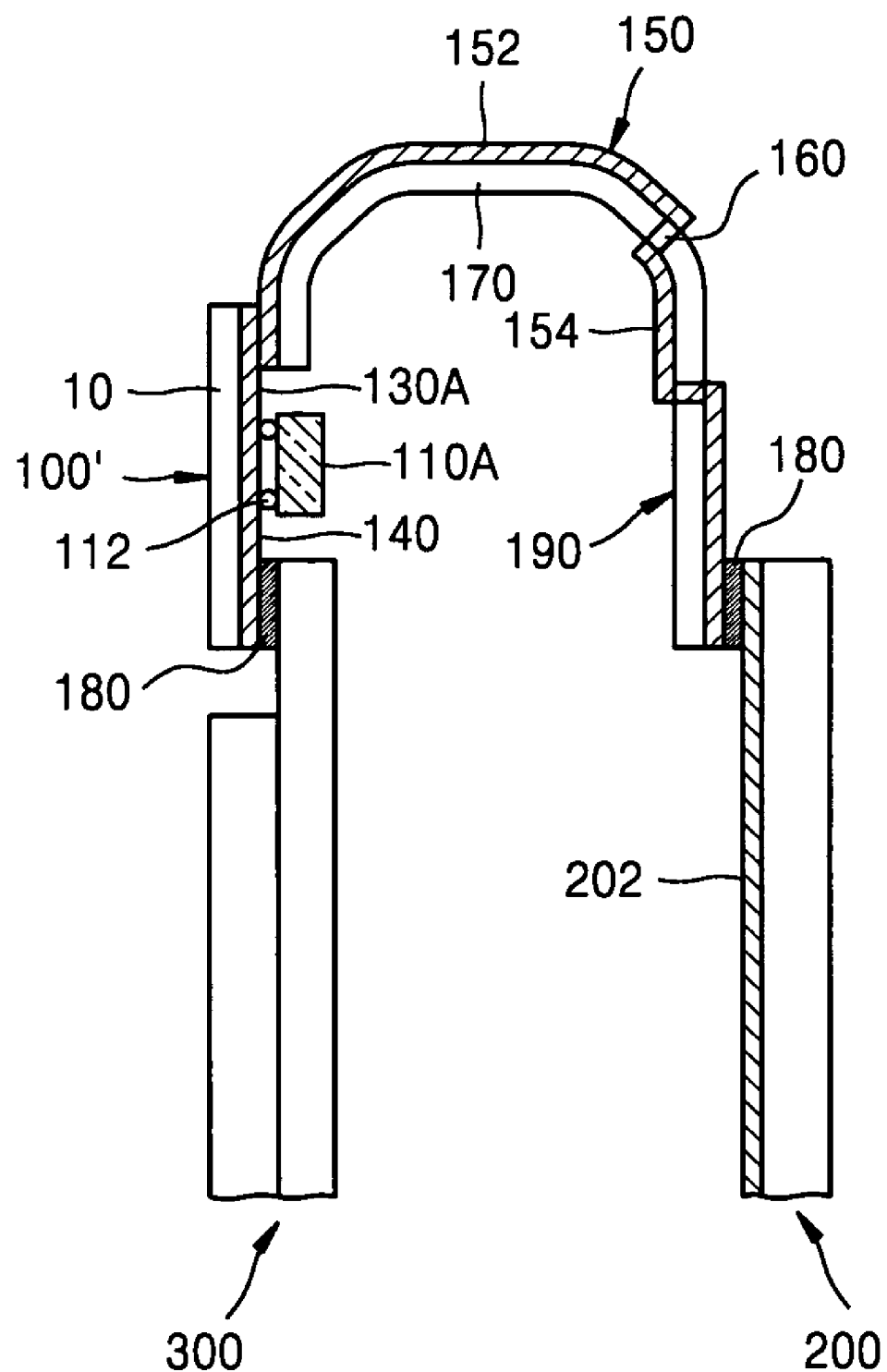
FIG. 10 is a cross-sectional view of a semiconductor package main body and the lower-cost input terminal connecting portion of FIG. 4, illustrating the manner in which the semiconductor package main body and the lower-cost input terminal connecting portion are formed.

FIG. 10 is a cross-sectional view of a semiconductor package main body and the low-cost input terminal connecting portion of FIG. 4, illustrating a shape into which the semiconductor package main body and the lower-cost input terminal connecting portion may be formed.

Figure 3:
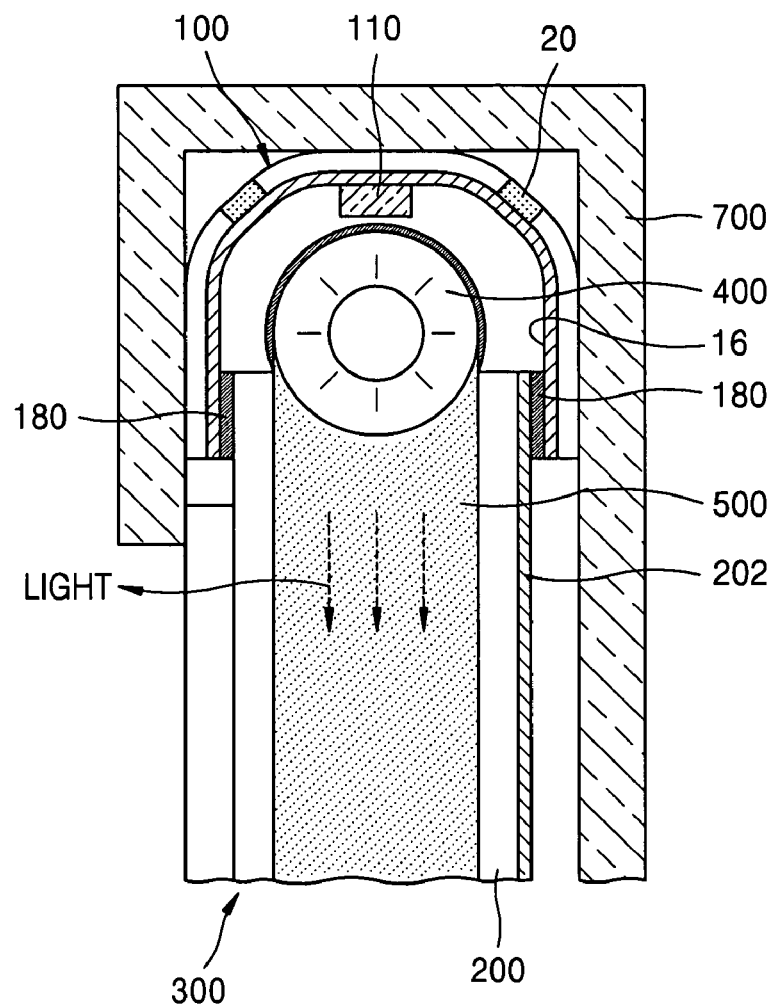
FIG. 3 is a cross-sectional view of the conventional flexible film package module of FIG. 1.

In the conventional flexible film package module shown in FIG. 3, the glass panel 300 is connected to the PCB 200 using a flexible film package with the semiconductor chip 110 of the semiconductor package main body 100 being positioned in the center of a bent portion. However, as illustrated in FIG. 10, in an exemplary example of the present invention, the semiconductor chip 110A of the semiconductor package main body 100' is not positioned in the center of a bent portion, but is, instead, positioned more closely adjacent the glass panel 300. In FIG. 10, reference numeral 180 denotes an ACF, and the bent portion is comprised primarily from the common second insulating substrate 170. The extended common input circuit patterns 152, 154 and 156, which may be disposed on a front surface and/or a rear surface of the common second insulating substrate 170, may be vertically connected to corresponding patterns on the opposite surface via through holes 160 and 162. Reference numeral 190 denotes a final connecting portion of the lower-cost input terminal connecting portion 150 and 112 denotes a bump connector formed on the semiconductor chip 110.

Figure 11:
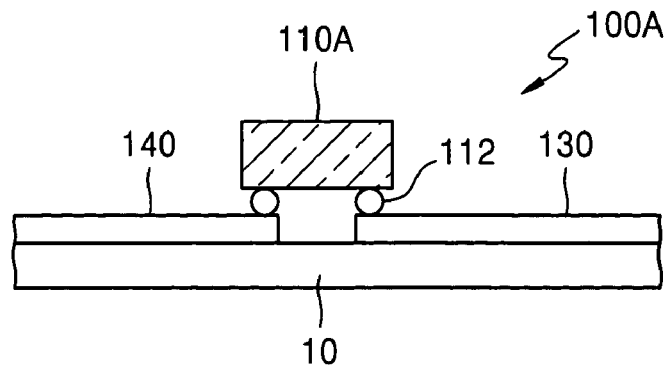
FIGS. 11–13 are cross-sectional views of semiconductor package main bodies, each of which can be applied to the flexible film package module of FIG. 4.
Figure 12:
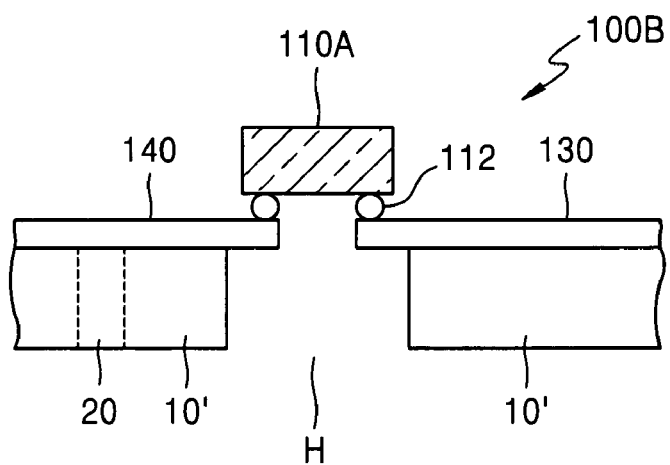
Figure 13:
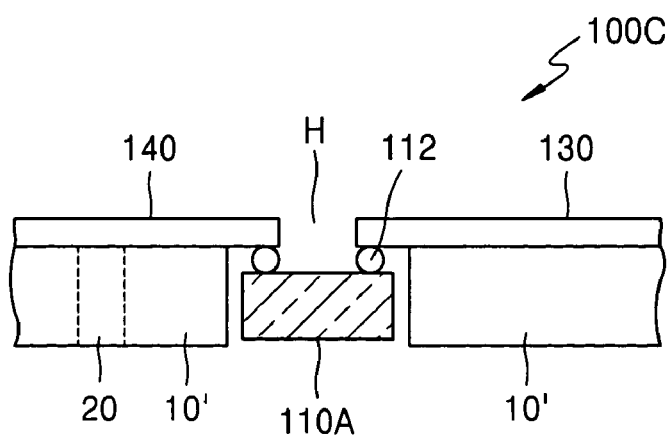

FIGS. 11–13 are cross-sectional views of semiconductor package main bodies, each of which can be applied to the flexible film package module of FIG. 4.

As shown in FIG. 11, a CoF package 100A can be used as a semiconductor package main body. Alternatively, as shown in FIGS. 12 and 13, TCPs 100B and 100C can be used. In the CoF package 100A, a first insulating substrate 10 has a relatively small thickness and includes no hole. However, in the TCPs 100B and 100C, a first insulating substrate 10' can have a larger thickness and include a central hole H. Also, a slit hole 20 is formed in the first insulating substrate to facilitate the bending of the first insulating substrate 10'. As shown in FIGS. 12 and 13, in the TCPs 100B and 100C, a semiconductor chip 110A can be selectively mounted above or below the first insulating substrate 10'.

As long as the foregoing semiconductor package main body 100A, 100B or 100C is connected to the low-cost input terminal connecting portion, various changes in form can be made thereto, while preserving the advantages of this invention. As explained above, a flexible film package module constructed according to the present invention may use a tape film comprising a combination of a lower-cost FPC insulating substrate and a higher-cost polyimide film, thereby allowing the entire production cost of flexible film packages to be reduced. Also, because a PCB can be scaled down by changing the shape of the lower-cost input terminal connecting portion, a highly integrated LCD device can be embodied easily in a range of configurations.

While the present invention has been particularly shown and described with reference to certain exemplary embodiments thereof, it will be understood by those of ordinary skill in the art that various changes in form and details may be made therein without departing from the spirit and scope of the present invention as defined by the following claims.

What is claimed is:

1. A flexible film package module comprising:
    a plurality of package main bodies, each package main body including a first insulating substrate, a chip mounting location and a first conductive pattern;
    a plurality of semiconductor chips mounted on the chip mounting locations;
    a package common body, the package common body including a second insulating substrate and a second conductive pattern;
    wherein each of the plurality of package main bodies is attached to the package common body and
    wherein the first conductive pattern is electrically connected to the second conductive pattern.

2. A flexible film package module according to claim 1, wherein:
    the chip mounting region includes a paddle region formed on the first insulating substrate; and
    the first conductive pattern includes an input circuit and an output circuit, wherein the input circuit is configured for electrical connection to the second conductive pattern and the output circuit is configured for connection to an electronic device.

3. A flexible film package module according to claim 2, wherein:
    the package common body includes a connector region arranged and configured for connection to a printed circuit board (PCB);
    and the electronic device includes a liquid crystal display (LCD).

4. A flexible film package module according to claim 1, wherein:
    the first insulating substrate is formed from a first insulating material; and
    the second insulating substrate is formed from a second insulating material, wherein the first insulating material is more expensive than the second insulating material.

5. A flexible film package module according to claim 1, wherein:
    the first insulating substrate is formed from a first insulating material; and the second insulating substrate is formed from a second insulating material, wherein the first insulating material is less flexible than the second insulating material.

6. A flexible film package module according to claim 1, wherein:
the first insulating substrate is formed from a first insulating material having a first coefficient of thermal expansion $CTE_1$ and a first durability; and
the second insulating substrate is formed from a second insulating material having a second coefficient of thermal expansion $CTE_2$ and a second durability,
wherein $CTE_1 < CTE_2$ and
wherein the first durability is greater than the second durability.

7. A flexible film package module according to claim 1, wherein:
the second insulating substrate includes a first major surface and a second major surface; and
the second conductive pattern includes a first portion formed on the first major surface and a second portion formed on the second major surface, the first portion being electrically connected to the second portion by conductive vias formed through the second insulating substrate.

8. A flexible film package module according to claim 1, wherein:
the input circuit pattern of each of the plurality of package main bodies is connected to the second conductive pattern using an anisotropic conductive film (ACF).

9. A flexible film package module according to claim 1, wherein:
the semiconductor chips are mounted on corresponding paddle regions using a plurality of conductive bumps.

* * * * *